(12) United States Patent
Huang et al.

(10) Patent No.: US 7,705,630 B1
(45) Date of Patent: Apr. 27, 2010

(54) NEGATIVE VOLTAGE LEVEL SHIFTER HAVING SIMPLIFIED STRUCTURE

(75) Inventors: Po-Hao Huang, Taichung (TW); Jie-Hau Huang, Tai-Chung Hsien (TW)

(73) Assignee: eMemory Technology Inc., Hsinchu (TW)

( * ) Notice: Subject to any disclaimer, the term of this patent is extended or adjusted under 35 U.S.C. 154(b) by 0 days.

(21) Appl. No.: 12/469,670

(22) Filed: May 20, 2009

(51) Int. Cl.
*H03K 19/0175* (2006.01)

(52) U.S. Cl. .............................. 326/63; 326/68; 326/80

(58) Field of Classification Search .................. 326/63, 326/68, 80–87
See application file for complete search history.

(56) References Cited

U.S. PATENT DOCUMENTS

| | | | |
|---|---|---|---|
| 4,560,889 A | * | 12/1985 | Hayashi ...................... 327/143 |
| 6,229,296 B1 | * | 5/2001 | Duesman et al. ........... 324/158.1 |
| 6,242,962 B1 | | 6/2001 | Nakamura |
| 6,943,587 B2 | * | 9/2005 | Joshi et al. ...................... 326/80 |

* cited by examiner

*Primary Examiner*—Vibol Tan
*Assistant Examiner*—Crystal L Hammond
(74) *Attorney, Agent, or Firm*—Winston Hsu

(57) ABSTRACT

A negative voltage level shifter having simplified structure includes a first inverter, a pass unit, a voltage-dividing unit, a second inverter, and a third inverter. The first inverter is powered with a positive supply voltage. Both the second and third inverters are powered with a negative supply voltage. The first inverter inverts an input signal for generating a first internal signal. The pass unit functions to forward the first internal signal to become a second internal signal when the first internal signal has a voltage greater than a threshold voltage. The voltage-dividing unit is employed to generate a third internal signal having a voltage divided from the negative supply voltage and the second internal signal. The second inverter inverts the third internal signal for generating a fourth internal signal. The third inverter inverts the fourth internal signal for generating an output signal.

20 Claims, 4 Drawing Sheets

NEGATIVE VOLTAGE LEVEL SHIFTER HAVING SIMPLIFIED STRUCTURE

BACKGROUND OF THE INVENTION

1. Field of the Invention

The present invention relates to a negative voltage level shifter, and more particularly, to a negative voltage level shifter having simplified structure.

2. Description of the Prior Art

Historically, the primary mode of reducing power consumption in electronic circuits has been to insistently scale down the power supply voltage. Recently, a move to 1.8 V power supply has been popularized among low-power and high-speed circuit designers. However, problems may arise when a low-voltage integrated circuit is coupled to a high-voltage integrated circuit, or when the output signal of an integrated circuit having positive operating voltage swing is utilized for driving another integrated circuit having negative operating voltage swing. That is, when a front-end integrated circuit having a first operating voltage swing is coupled to a back-end integrated circuit having a second operating voltage swing, the first operating voltage swing of the output signal generated by the front-end integrated circuit is required to be converted into the second operating voltage swing by making use of a voltage conversion interface.

Please refer to FIG. 1, which is a circuit diagram schematically showing a prior-art negative voltage level shifter. As shown in FIG. 1, the negative voltage level shifter 100 comprises a first voltage level processing unit 110, an inverting unit 150, and a second voltage level processing unit 160. The negative voltage level shifter 100 is powered with a positive supply voltage Vcc, a negative supply voltage −Vpp, and a middle negative supply voltage −Vpp/2. The negative voltage level shifter 100 receives an input signal Sin having a positive operating voltage swing, e.g. between 0V and the positive supply voltage Vcc, generated by a first circuit unit 101 and functions to convert the input signal Sin into an output signal Sout having a negative operating voltage swing, e.g. between 0V and the negative supply voltage −Vpp, for use in a second circuit unit 102. The first voltage level processing unit 110 is employed to convert the input signal Sin into a first internal signal Sintx1 having an operating voltage swing between −Vpp/2 and Vcc. The inverting unit 150 is utilized for inverting the first internal signal Sintx1 to generate a second internal signal Sintx2 having an operating voltage swing between −Vpp/2 and 0V. The second voltage level processing unit 160 is employed to convert the second internal signal Sintx2 into the output signal Sout having desired negative operating voltage swing between 0V and −Vpp.

The first voltage level processing unit 110 comprises an inverter 120, PMOS (P-type metal oxide semiconductor) transistors 126 and 127, and NMOS (N-type metal oxide semiconductor) transistors 131 and 132. The NMOS transistors 131 and 132 are electrically connected to form a latch circuit 140. The inverting unit 150 comprises a PMOS transistor 151 and an NMOS transistor 152. The second voltage level processing unit 160 comprises PMOS transistors 161~163 and NMOS transistors 171~173. The PMOS transistor 161 and the NMOS transistor 171 are electrically connected to form an inverter 170. The NMOS transistors 172 and 173 are electrically connected to form a latch circuit 190. That is, the negative voltage level shifter 100 performs a negative voltage level shifting operation based on two voltage level processing units 110, 160 interfaced by the inverting unit 150. Since the circuit operation of the negative voltage level shifter 100 is performed with the aid of two negative supply voltages −Vpp and −Vpp/2, more complicated peripheral circuits are required to generate the negative supply voltages −Vpp and −Vpp/2. Furthermore, during the circuit operation of the negative voltage level shifter 100, the maximum voltage stress, occurring to the PMOS transistors 126, 127 and the NMOS transistors 131, 132, 152, reaches a high voltage drop of (Vcc+Vpp/2), i.e. between the positive supply voltage Vcc and the middle negative supply voltage −Vpp/2. In view of that, the circuit of the negative voltage level shifter 100 is complicated and costly due to the demand of latch circuits and high voltage transistors for use therein.

SUMMARY OF THE INVENTION

In accordance with an embodiment of the present invention, a negative voltage level shifter having simplified structure is disclosed for performing a negative voltage level shifting operation. The negative voltage level shifter comprises a first inverter, a pass unit, a voltage-dividing unit, a second inverter, and a third inverter.

The first inverter comprises an input end for receiving an input signal and an output end for outputting a first internal signal. The first inverter is powered with a positive supply voltage and performs an inverting operation on the input signal for generating the first internal signal. The pass unit comprises an input end electrically connected to the output end of the first inverter for receiving the first internal signal and an output end for outputting a second internal signal. The pass unit enables an electrical connection between the input and output ends thereof when the first internal signal has a voltage greater than a threshold voltage. Alternatively, the pass unit disables the electrical connection between the input and output ends thereof when the first internal signal has a voltage less than the threshold voltage. The voltage-dividing unit comprises a first end electrically connected to the output end of the pass unit for receiving the second internal signal, a second end for receiving a negative supply voltage, and a third end for outputting a third internal signal having a voltage divided from both the negative supply voltage and the second internal signal based on a circuit operation of superposition theory. The second inverter comprises an input end electrically connected to the third end of the voltage-dividing unit for receiving the third internal voltage and an output end for outputting a fourth internal signal. The second inverter is powered with the negative supply voltage and performs an inverting operation on the third internal signal for generating the fourth internal signal. The third inverter comprises an input end electrically connected to the output end of the second inverter for receiving the fourth internal voltage and an output end for outputting an output signal. The third inverter is powered with the negative supply voltage and performs an inverting operation on the fourth internal signal for generating the output signal.

These and other objectives of the present invention will no doubt become obvious to those of ordinary skill in the art after reading the following detailed description of the preferred embodiment that is illustrated in the various figures and drawings.

DETAILED DESCRIPTION

Hereinafter, preferred embodiments of the present invention will be described in detail with reference to the accompanying drawings. Here, it is to be noted that the present invention is not limited thereto.

Figure 1:
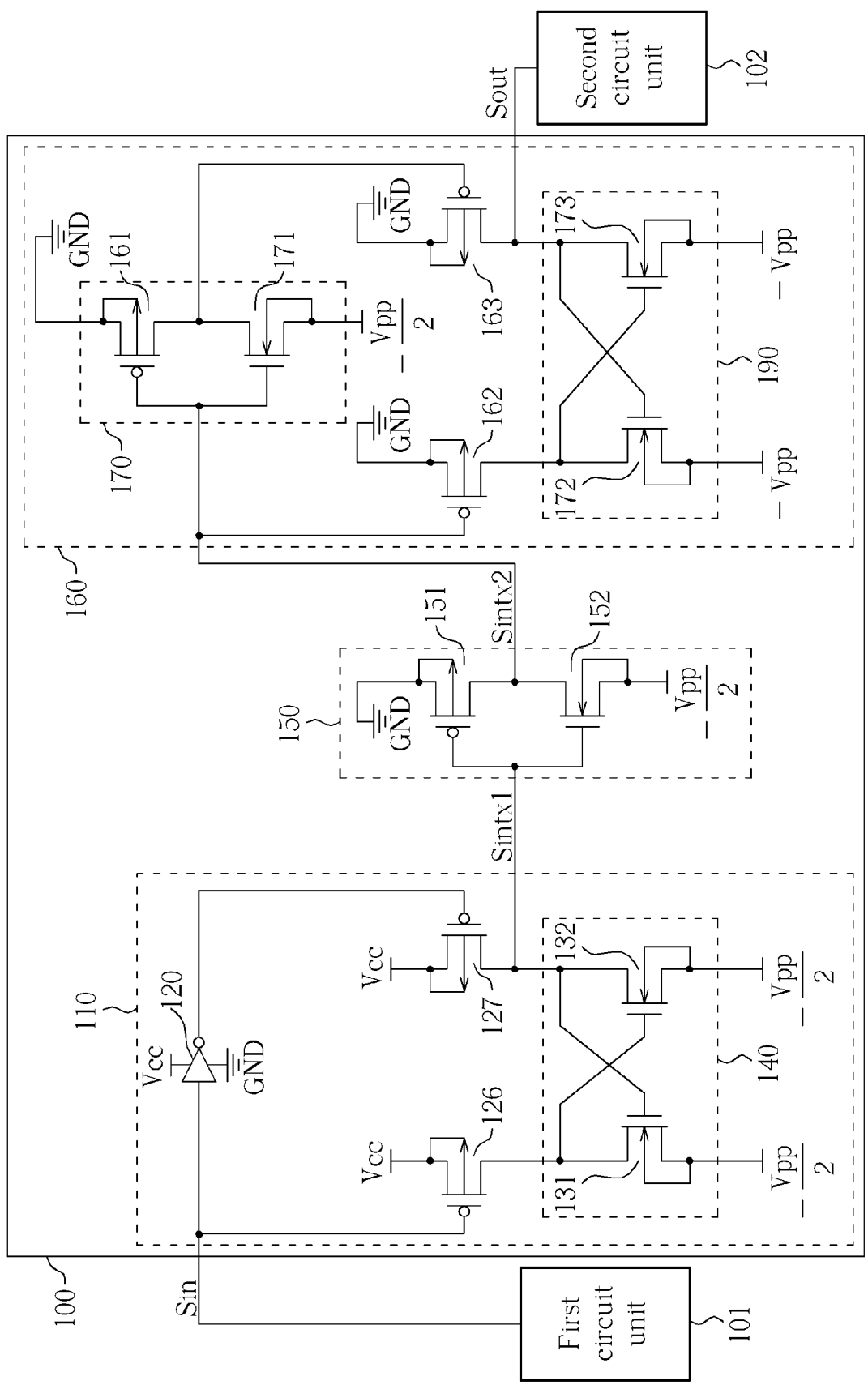
FIG. 1 is a circuit diagram schematically showing a prior-art negative voltage level shifter.
Figure 2:
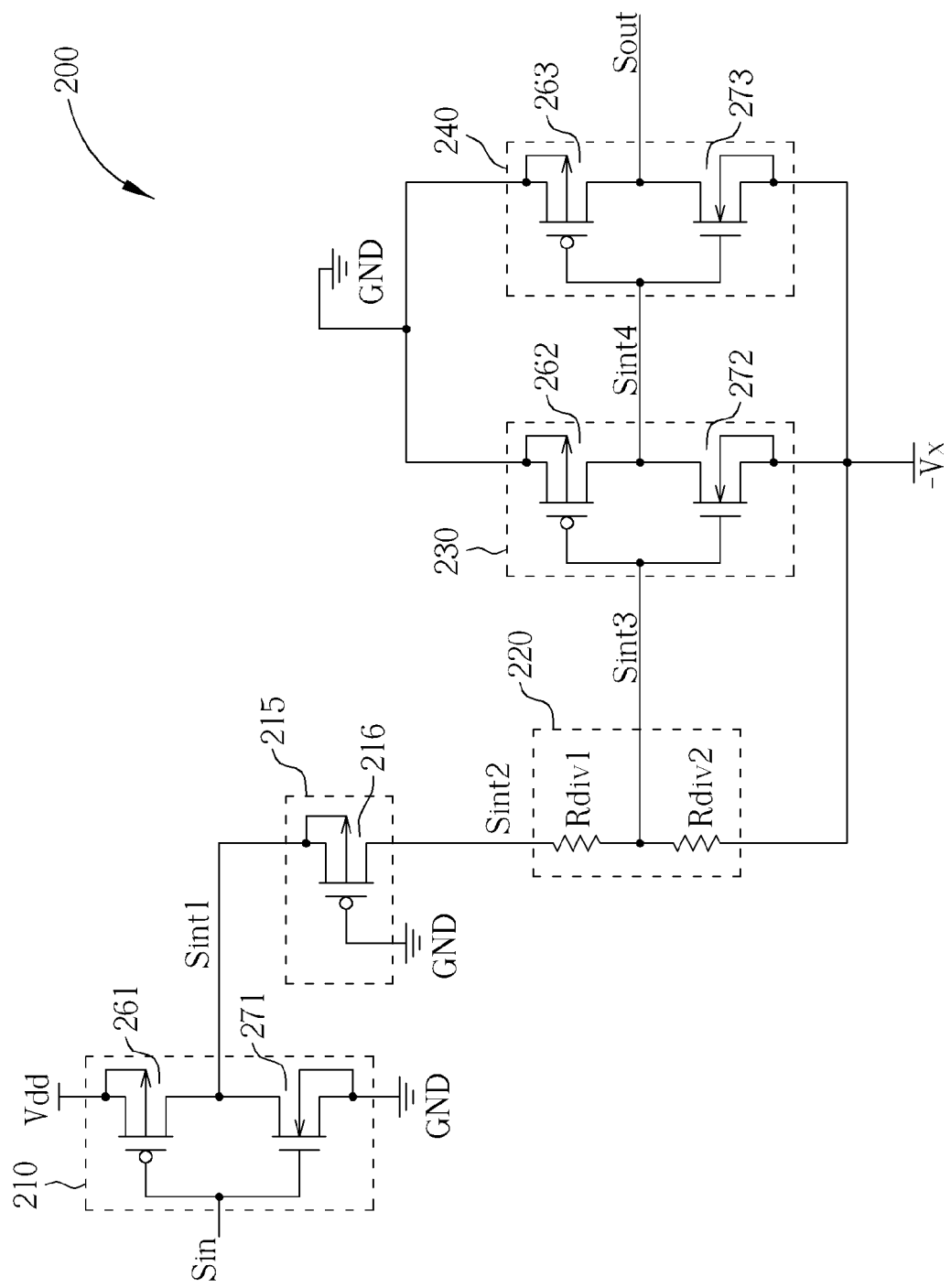
FIG. 2 is a circuit diagram schematically showing a negative voltage level shifter in accordance with a first embodiment of the present invention.

FIG. 2 is a circuit diagram schematically showing a negative voltage level shifter in accordance with a first embodiment of the present invention. As shown in FIG. 2, the negative voltage level shifter 200 comprises a first inverter 210, a pass unit 215, a voltage-dividing unit 220, a second inverter 230, and a third inverter 240. The negative voltage level shifter 200 is employed to convert an input signal Sin having a positive operating voltage swing into an output signal Sout having a negative operating voltage swing. The positive operating voltage swing falls into a voltage range between a positive supply voltage Vdd and ground voltage. The negative operating voltage swing falls into a voltage range between a negative supply voltage −Vx and ground voltage.

The first inverter 210 comprises an input end for receiving an input signal Sin and an output end for outputting a first internal signal Sint1. The first inverter 210 is powered with the positive supply voltage Vdd and performs an inverting operation on the input signal Sin for generating the first internal signal Sint1. The pass unit 215 comprises an input end electrically connected to the first inverter 210 for receiving the first internal signal Sint1 and an output end for outputting a second internal signal Sint2. The pass unit 215 enables an electrical connection between the input and output ends thereof when the first internal signal Sint1 has a voltage greater than a threshold voltage. Alternatively, the pass unit 215 disables the electrical connection between the input and output ends thereof when the first internal signal Sint1 has a voltage less than the threshold voltage.

The voltage-dividing unit 220 comprises a first end electrically connected to the output end of the pass unit 215 for receiving the second internal signal Sint2, a second end for receiving the negative supply voltage −Vx, and a third end for outputting a third internal signal Sint3 having a voltage divided from both the negative supply voltage −Vx and the second internal signal Sint2 based on a circuit operation of superposition theory. The second inverter 230 comprises an input end electrically connected to the third end of the voltage-dividing unit 220 for receiving the third internal voltage Sint3 and an output end for outputting a fourth internal signal Sint4. The second inverter 230 is powered with the negative supply voltage −Vx and performs an inverting operation on the third internal signal Sint3 for generating the fourth internal signal Sint4. The third inverter 240 comprises an input end electrically connected to the second inverter 230 for receiving the fourth internal voltage Sint4 and an output end for outputting an output signal Sout. The third inverter 240 is powered with the negative supply voltage −Vx and performs an inverting operation on the fourth internal signal Sint4 for generating the output signal Sout.

In the first embodiment of the present invention shown in FIG. 2, the first inverter 210 comprises a first transistor 261 and a second transistor 271; the pass unit 215 comprises a pass transistor 216; the voltage-dividing unit 220 comprises a first resistor Rdiv1 and a second resistor Rdiv2; the second inverter 230 comprises a first transistor 262 and a second transistor 272; and the third inverter 240 comprises a first transistor 263 and a second transistor 273. The first transistors 261~263 and the pass transistor 216 are PMOS transistors or P-type junction field effect transistors. The second transistors 271~273 are NMOS transistors or N-type junction field effect transistors.

The first transistor 261 comprises a first end for receiving the positive supply voltage Vdd, a gate end for receiving the input signal Sin, a second end electrically connected to the pass transistor 216, and a channel well electrically connected to the first end thereof. The second transistor 271 comprises a first end electrically connected to the second end of the first transistor 261, a gate end electrically connected to the gate end of the first transistor 261, a second end electrically connected to ground terminal GND, and a channel well electrically connected to the second end thereof. The pass transistor 216 comprises a first end electrically connected to the second end of the first transistor 261, a gate end electrically connected to ground terminal GND, a second end electrically connected to the voltage-dividing unit 220, and a channel well electrically connected to the first end thereof. The first resistor Rdiv1 comprises a first end electrically connected to the second end of the pass transistor 216 and a second end electrically connected to the second inverter 230. The second resistor Rdiv2 comprises a first end electrically connected to the second end of the first resistor Rdiv1 and a second end for receiving the negative supply voltage −Vx.

The first transistor 262 comprises a first end electrically connected to ground terminal GND, a gate end electrically connected to the second end of the first resistor Rdiv1, a second end electrically connected to the third inverter 240, and a channel well electrically connected to the first end thereof. The second transistor 272 comprises a first end electrically connected to the second end of the first transistor 262, a gate end electrically connected to the gate end of the first transistor 262, a second end for receiving the negative supply voltage −Vx, and a channel well electrically connected to the second end thereof. The first transistor 263 comprises a first end electrically connected to ground terminal GND, a gate end electrically connected to the second end of the first transistor 262, a second end for outputting the output signal Sout, and a channel well electrically connected to the first end thereof. The second transistor 273 comprises a first end electrically connected to the second end of the first transistor 263, a gate end electrically connected to the gate end of the first transistor 263, a second end for receiving the negative supply voltage −Vx, and a channel well electrically connected to the second end thereof. The circuit operation of the negative voltage level shifter 200 is set forth as the followings.

After the first inverter 210 inverts the input signal Sin with the aid of the positive supply voltage Vdd, the first internal signal Sint1 having operating voltage swing between ground voltage (0V) and the positive supply voltage Vdd is generated. That is, both the first internal signal Sint1 and the input signal Sin have substantially identical operating voltage swing. When the first internal signal Sint1 holds a high level voltage such as the positive supply voltage Vdd corresponding to the input signal Sin having a low level voltage such as ground voltage, the pass transistor 216 is turned on for passing the first internal signal Sint1 to become the second internal signal Sint2; in turn, the second internal signal Sint2 and the negative supply voltage −Vx are divided by the voltage-dividing unit 220 based on a circuit operation of superposition theory for generating the third internal signal Sint3. When the first internal signal Sint1 holds a low level voltage such as ground voltage corresponding to the input signal Sin having a high level voltage such as the positive supply voltage Vdd, the pass transistor 216 is turned off and the second internal signal Sint2 holds the negative supply voltage −Vx; furthermore, the third internal signal Sint3 also holds the negative supply voltage −Vx. In one embodiment, the resistances of the first resistor Rdiv1 and the second resistor Rdiv2 are well adjusted so that the third internal signal Sint3 holds a voltage approximated to 0V when the second internal signal Sint2 holds the high level voltage such as the positive supply voltage Vdd. In other words, the operating voltage swing of the third internal signal Sint3 falls into a voltage range between ground voltage (0V) and the negative supply voltage −Vx.

After the second inverter 230 inverts the third internal signal Sint3 with the aid of the negative supply voltage −Vx, the fourth internal signal Sint4 having operating voltage swing between ground voltage (0V) and the negative supply voltage −Vx is generated. That is, both the fourth internal signal Sint4 and the third internal signal Sint3 have substantially identical operating voltage swing. After the third inverter 240 inverts the fourth internal signal Sint4 with the aid of the negative supply voltage −Vx, the output signal Sout having operating voltage swing between ground voltage (0V) and the negative supply voltage −Vx is generated. In view of that, the negative voltage level shifter 200 functions to convert the input signal Sin having positive operating voltage swing, e.g. between positive supply voltage Vdd and ground voltage (0V), into the output signal Sout having negative operating voltage swing, e.g. between ground voltage (0V) and the negative supply voltage −Vx.

Compared with the prior-art negative voltage level shifter 100, the negative voltage level shifter 200 performs a negative voltage level shifting operation essentially based on just three inverters without the aid of any latch circuit. Besides, the negative voltage level shifter 200 is powered with just the positive supply voltage Vdd and the negative supply voltage −Vx without the aid of any middle negative supply voltage. In summary, the negative voltage level shifter 200 of the present invention is capable of performing the negative voltage level shifting operation based on a simplified and cost-effective circuit.

Figure 3:
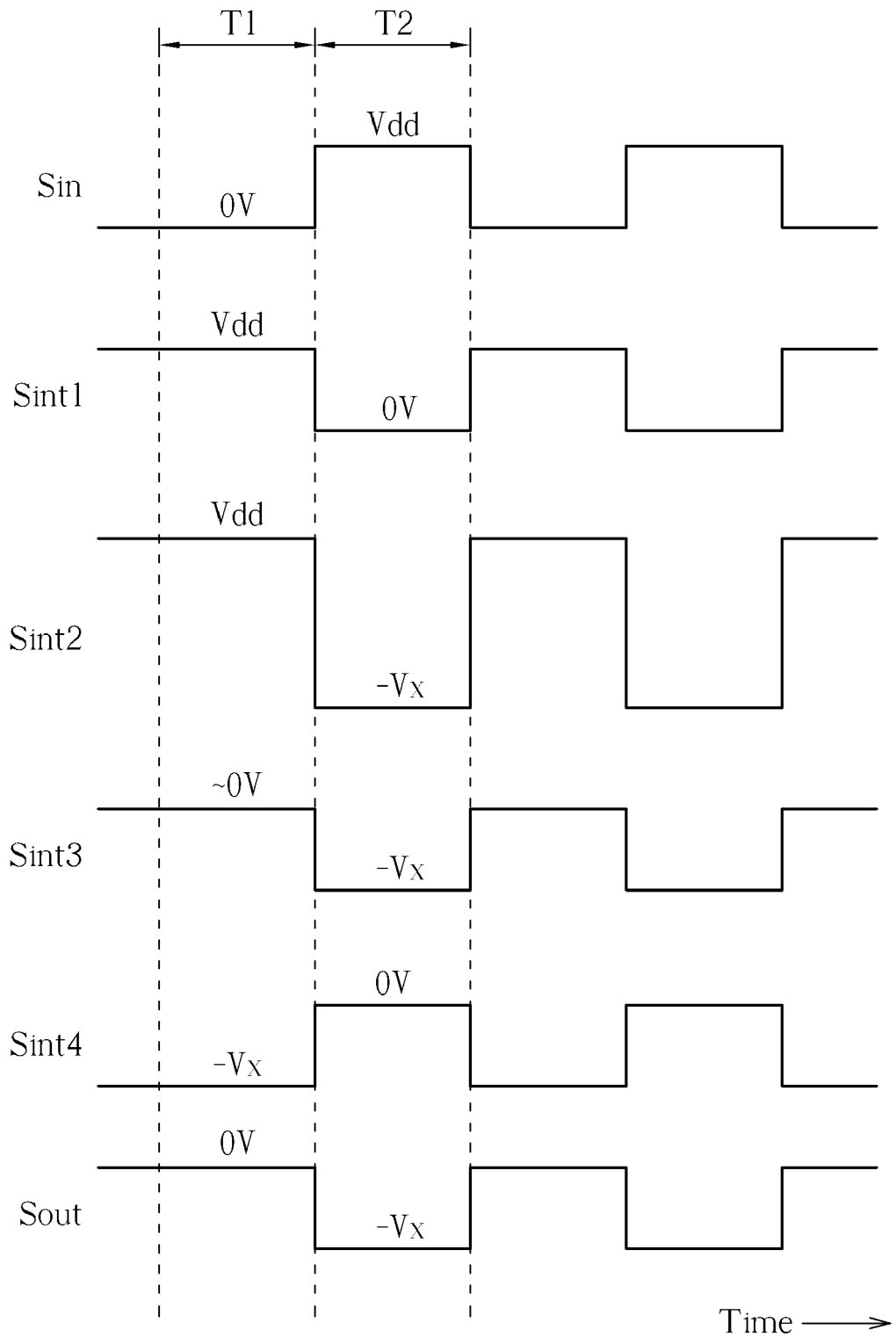
FIG. 3 shows related signal waveforms regarding circuit operations of the negative voltage level shifter in FIG. 2, having time along the abscissa.

FIG. 3 shows related signal waveforms regarding circuit operations of the negative voltage level shifter 200 in FIG. 2, having time along the abscissa. The signal waveforms in FIG. 3, from top to bottom, are the input signal Sin, the first internal signal Sint1, the second internal signal Sint2, the third internal signal Sint3, the fourth internal signal Sint4, and the output signal Sout. During interval T1, the input signal Sin holds ground voltage (0V) and the first inverter 210 outputs the first internal signal Sint1 having the voltage Vdd. Accordingly, the pass transistor 216 is turned on so that the second internal signal Sint2 also holds the voltage Vdd. Then, the third internal signal Sint3 turns out to have a voltage approximated to ground voltage (0V) divided from both the voltages Vdd and −Vx based on a circuit operation of superposition theory. The second inverter 230 generates the fourth internal signal Sint4 having the voltage −Vx by inverting the third internal signal Sint3 having approximately ground voltage. Furthermore, the third inverter 240 generates the output signal Sout having ground voltage (0V) by inverting the fourth internal signal Sint4.

During interval T2, the input signal Sin holds the voltage Vdd and the first inverter 210 outputs the first internal signal Sint1 having ground voltage (0V). Therefore, the pass transistor 216 is turned off so that both the second internal signal Sint2 and the third internal signal Sint3 hold the voltage −Vx. The second inverter 230 generates the fourth internal signal Sint4 having ground voltage (0V) by inverting the third internal signal Sint3 having the voltage −Vx. Furthermore, the third inverter 240 generates the output signal Sout having the voltage −Vx by inverting the fourth internal signal Sint4.

In the aforementioned circuit operations, the maximum voltage stress on the transistors used in the negative voltage level shifter 200 is just a voltage drop of Vx, i.e. between ground voltage (0V) and the negative supply voltage −Vx. For instance, during interval T1, the maximum voltage stress occurs to the first transistors 262, 263 and the second transistors 272, 273; meanwhile, a voltage stress of Vdd occurs to the pass transistor 216, the first transistor 261, and the second transistor 271. Alternatively, during interval T2, the maximum voltage stress occurs to the pass transistor 216, the first transistors 262, 263 and the second transistors 272, 273; meanwhile, a voltage stress of Vdd occurs to the first transistor 261 and the second transistor 271. For that reason, an occurrence of voltage stress greater than Vx on any transistor used in the negative voltage level shifter 200 is avoided. In one embodiment, the positive supply voltage Vdd is set to be a voltage of 3.3 V and the negative supply voltage −Vx is set to be a voltage of −6V; therefore, the maximum voltage stress on the transistors used in the negative voltage level shifter 200 is just a voltage drop of 6V. Accordingly, the negative voltage level shifter 200 can be realized without any high voltage transistor for further reducing production cost.

Figure 4:
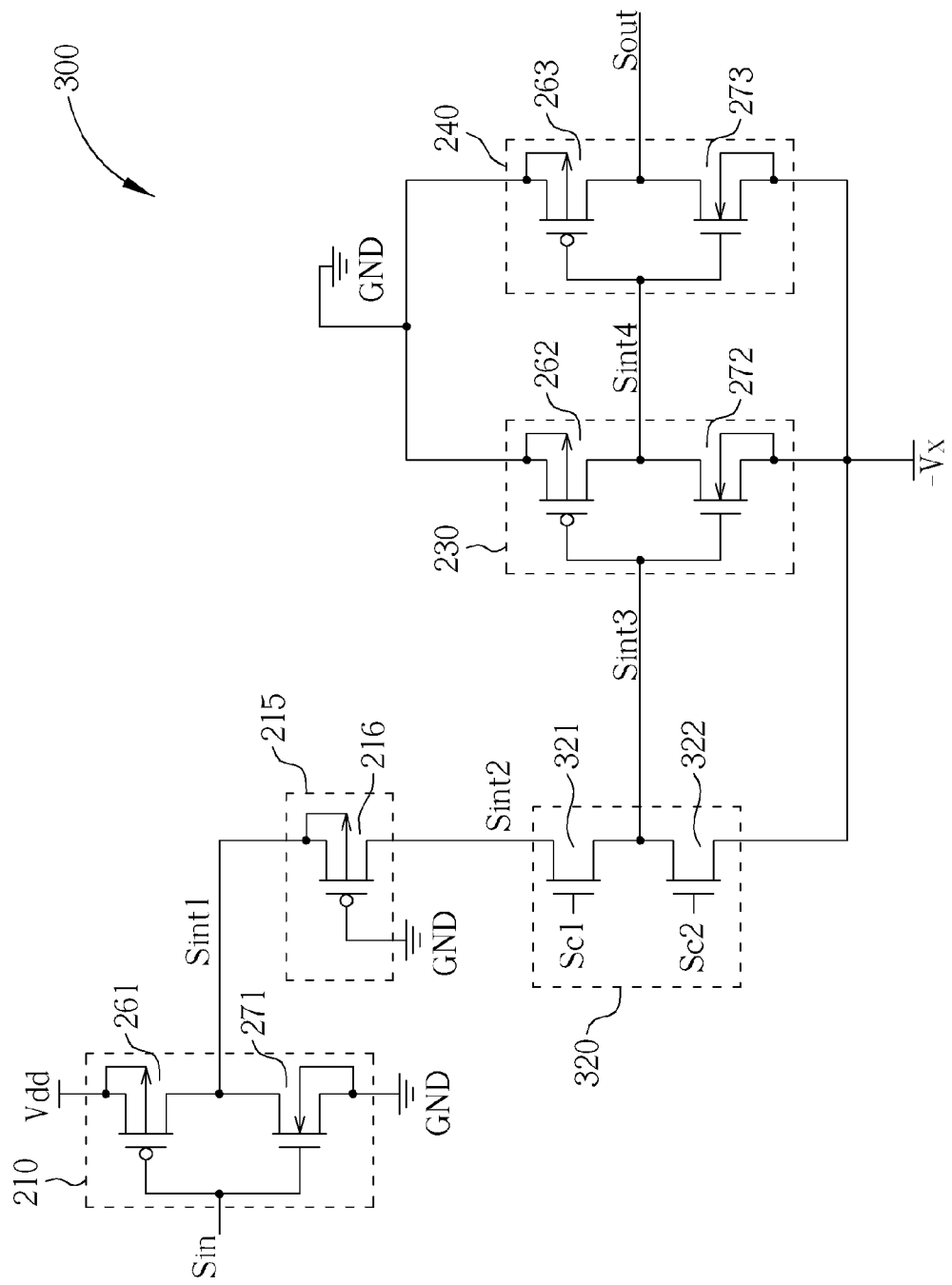
FIG. 4 is a circuit diagram schematically showing a negative voltage level shifter in accordance with a second embodiment of the present invention.

Please refer to FIG. 4, which is a circuit diagram schematically showing a negative voltage level shifter in accordance with a second embodiment of the present invention. As shown in FIG. 4, the circuit structure of the negative voltage level shifter 300 is similar to that of the negative voltage level shifter 200 shown in FIG. 2, differing only in that the voltage-dividing unit 220 is replaced with a voltage-dividing unit 320. The voltage-dividing unit 320 comprises a third transistor 321 and a fourth transistor 322. The third transistor 321 comprises a first end electrically connected to the second end of the pass transistor 216, a gate end for receiving a first control signal Sc1, and a second end electrically connected to the gate end of the first transistor 262. The first control signal Sc1 is employed to adjust a first channel resistance of the third transistor 321. The fourth transistor 322 comprises a first end electrically connected to the second end of the third transistor 321, a gate end for receiving a second control signal Sc2, and a second end for receiving the negative supply voltage −Vx. The second control signal Sc2 is employed to adjust a second channel resistance of the fourth transistor 322. The third transistor 321 and the fourth transistor 322 are MOS transistors or junction field effect transistors.

Basically, the voltage-dividing unit 320 is an adjustable voltage divider. When the pass transistor 216 is turned on, the voltage-dividing unit 320 performs a voltage dividing operation on both the second internal signal Sint2 and the negative supply voltage −Vx based on a circuit operation of superposition theory for generating the third internal signal Sint3 having a voltage approximated to ground voltage (0V) according to the adjusted first and second channel resistances. For that reason, if the voltage of the third internal signal Sint3 deviates from ground voltage significantly due to an occurrence of component aging or other unexpected events, the first control signal Sc1 and the second control signal Sc2 can be adjusted for correcting the voltage of the third internal signal Sint3.

In another embodiment, both the gate ends of the third transistor 321 and the fourth transistor 322 are employed to receive same control signal, i.e. the first control signal Sc1 is identical to the second control signal Sc2; furthermore, the channel width/length ratio of the third transistor 321 can be substantially identical to or different from that of the fourth transistor 322. Since the first channel resistance is determined by the channel width/length ratio of the third transistor 321 and the second channel resistance is determined by the channel width/length ratio of the fourth transistor 322, the dividing ratio of the voltage-dividing unit 320 is determined by the channel width/length ratios of the third transistor 321 and the fourth transistor 322.

In conclusion, by making use of a voltage-dividing unit, a pass unit, and a plurality of inverters, the negative voltage level shifter of the present invention is capable of performing a negative voltage level shifting operation based on just a positive supply voltage and a negative supply voltage without the aid of any latch circuit and any middle negative supply voltage; besides, the maximum voltage stress on the transistors used is reduced significantly. That is, the negative voltage level shifter of the present invention is realized with a simplified circuit for reducing production cost.

The present invention is by no means limited to the embodiments as described above by referring to the accompanying drawings, which may be modified and altered in a variety of different ways without departing from the scope of the present invention. Thus, it should be understood by those skilled in the art that various modifications, combinations, sub-combinations and alternations might occur depending on design requirements and other factors insofar as they are within the scope of the appended claims or the equivalents thereof.

What is claimed is:

1. A negative voltage level shifter, comprising:
   a first inverter comprising an input end for receiving an input signal and an output end for outputting a first internal signal, the first inverter being powered with a positive supply voltage and performing an inverting operation on the input signal for generating the first internal signal;
   a pass unit comprising an input end electrically connected to the output end of the first inverter for receiving the first internal signal and an output end for outputting a second internal signal, the pass unit enabling an electrical connection between the input and output ends thereof when the first internal signal has a voltage greater than a threshold voltage, the pass unit disabling the electrical connection between the input and output ends thereof when the first internal signal has a voltage less than the threshold voltage;
   a voltage-dividing unit comprising a first end electrically connected to the output end of the pass unit for receiving the second internal signal, a second end for receiving a negative supply voltage, and a third end for outputting a third internal signal having a voltage divided from the negative supply voltage and the second internal signal based on a circuit operation of superposition theory;
   a second inverter comprising an input end electrically connected to the third end of the voltage-dividing unit for receiving the third internal voltage and an output end for outputting a fourth internal signal, the second inverter being powered with the negative supply voltage and performing an inverting operation on the third internal signal for generating the fourth internal signal; and
   a third inverter comprising an input end electrically connected to the output end of the second inverter for receiving the fourth internal voltage and an output end for outputting an output signal, the third inverter being powered with the negative supply voltage and performing an inverting operation on the fourth internal signal for generating the output signal.

2. The negative voltage level shifter of claim 1, wherein the pass unit comprises a pass transistor comprising:
   a first end electrically connected to the output end of the first inverter for receiving the first internal signal;
   a gate end electrically connected to a ground terminal; and
   a second end for outputting the second internal signal.

3. The negative voltage level shifter of claim 2, wherein the pass transistor further comprises:
   a channel well electrically connected to the first end of the pass transistor.

4. The negative voltage level shifter of claim 2, wherein the pass transistor is a PMOS (P-type metal oxide semiconductor) transistor or a P-type junction field effect transistor.

5. The negative voltage level shifter of claim 1, wherein the first inverter comprises:
   a first transistor comprising a first end for receiving the positive supply voltage, a gate end for receiving the input signal, a second end electrically connected to the input end of the pass unit, and a channel well electrically connected to the first end of the first transistor; and
   a second transistor comprising a first end electrically connected to the second end of the first transistor, a gate end electrically connected to the gate end of the first transistor, a second end electrically connected to a ground terminal, and a channel well electrically connected to the second end of the second transistor.

6. The negative voltage level shifter of claim 5, wherein the first transistor is a PMOS transistor or a P-type junction field effect transistor.

7. The negative voltage level shifter of claim 5, wherein the second transistor is an NMOS transistor or an N-type junction field effect transistor.

8. The negative voltage level shifter of claim 1, wherein the voltage-dividing unit comprises:
   a first resistor comprising a first end electrically connected to the output end of the pass unit and a second end electrically connected to the input end of the second inverter; and
   a second resistor comprising a first end electrically connected to the second end of the first resistor and a second end for receiving the negative supply voltage.

9. The negative voltage level shifter of claim 8, wherein the third internal signal, outputted from the third end of the voltage-dividing unit, has a voltage approximated to a ground voltage based on a circuit operation of superposition theory regarding resistances of the first and second resistors when the first internal signal has a voltage greater than the threshold voltage.

10. The negative voltage level shifter of claim 1, wherein the voltage-dividing unit comprises:
    a first transistor comprising a first end electrically connected to the output end of pass unit, a gate end for receiving a first control signal, and a second end electrically connected to the input end of the second inverter; and
    a second transistor comprising a first end electrically connected to the second end of the first transistor, a gate end for receiving a second control signal, and a second end for receiving the negative supply voltage.

11. The negative voltage level shifter of claim 10, wherein the third internal signal, outputted from the third end of the voltage-dividing unit, has a voltage approximated to a ground voltage based on a circuit operation of superposition theory regarding channel resistances of the first and second transistors when the first internal signal has a voltage greater than the threshold voltage.

12. The negative voltage level shifter of claim 10, wherein the first and second transistors are MOS transistors or junction field effect transistors.

13. The negative voltage level shifter of claim 10, wherein a channel width/length ratio of the first transistor is substantially identical to a channel width/length ratio of the second transistor.

14. The negative voltage level shifter of claim 10, wherein a channel width/length ratio of the first transistor is different from a channel width/length ratio of the second transistor.

15. The negative voltage level shifter of claim 1, wherein the second inverter comprises:
   a first transistor comprising a first end electrically connected to a ground terminal, a gate end electrically connected to the third end of the voltage-dividing unit for receiving the third internal signal, a second end electrically connected to the input end of the third inverter, and a channel well electrically connected to the first end of the first transistor; and
   a second transistor comprising a first end electrically connected to the second end of the first transistor, a gate end electrically connected to the gate end of the first transistor, a second end for receiving the negative supply voltage, and a channel well electrically connected to the second end of the second transistor.

16. The negative voltage level shifter of claim 15, wherein the first transistor is a PMOS transistor or a P-type junction field effect transistor.

17. The negative voltage level shifter of claim 15, wherein the second transistor is an NMOS transistor or an N-type junction field effect transistor.

18. The negative voltage level shifter of claim 1, wherein the third inverter comprises:
   a first transistor comprising a first end electrically connected to a ground terminal, a gate end electrically connected to the output end of the second inverter for receiving the fourth internal signal, a second end for outputting the output signal, and a channel well electrically connected to the first end of the first transistor; and
   a second transistor comprising a first end electrically connected to the second end of the first transistor, a gate end electrically connected to the gate end of the first transistor, a second end for receiving the negative supply voltage, and a channel well electrically connected to the second end of the second transistor.

19. The negative voltage level shifter of claim 18, wherein the first transistor is a PMOS transistor or a P-type junction field effect transistor.

20. The negative voltage level shifter of claim 18, wherein the second transistor is an NMOS transistor or an N-type junction field effect transistor.

* * * * *